US010475039B2

(12) United States Patent
Jiang

(10) Patent No.: US 10,475,039 B2
(45) Date of Patent: Nov. 12, 2019

(54) IN-MEMORY SIMULATIONS USING MULTIDIMENSIONAL CUBES

(71) Applicant: SAP SE, Walldorf (DE)

(72) Inventor: Shan Jiang, San Jose, CA (US)

(73) Assignee: SAP SE, Walldorf (DE)

( * ) Notice: Subject to any disclaimer, the term of this patent is extended or adjusted under 35 U.S.C. 154(b) by 939 days.

(21) Appl. No.: 13/710,345

(22) Filed: Dec. 10, 2012

(65) Prior Publication Data

US 2014/0163944 A1    Jun. 12, 2014

(51) Int. Cl.
*G06F 17/50* (2006.01)
*G06Q 30/00* (2012.01)
*G06Q 10/00* (2012.01)

(52) U.S. Cl.
CPC ......... *G06Q 30/00* (2013.01); *G06F 17/5009* (2013.01); *G06Q 10/00* (2013.01)

(58) Field of Classification Search
None
See application file for complete search history.

(56) References Cited

U.S. PATENT DOCUMENTS

| 6,775,675 B1* | 8/2004 | Nwabueze ........ G06F 17/30554 707/600 |
| 2005/0010550 A1* | 1/2005 | Potter ................... G06F 16/283 |
| 2013/0086547 A1* | 4/2013 | Said .......................... G06F 8/73 717/104 |

OTHER PUBLICATIONS

Lakshmanan et al., "What-if OLAP Queries with Changing Dimensions—Perspectives are Everything", VLDB '07, 2007, http://cs.russakovsky.com/persVLDB.pdf.*
Schaffner et al., "A Hybrid Row-Column OLTP Database Architecture for Operational Reporting", Lecture Notes in Business Information Processing, vol. 27, 2009, pp. 61-74.*
Bergendahl, "Le Generator: a test data synthesis framework", Master's Thesis in Computer Science, Royal Institute of Technology, Sweden, 2009, 36 pages.*
Wang et al., "Hypothetical Analysis on Basis of View", Applied Mechanics and Materials, vols. 44-47, pp. 4007-4011, Online Dec. 6, 2010.*

* cited by examiner

*Primary Examiner* — Aniss Chad
(74) *Attorney, Agent, or Firm* — Mintz Levin Cohn Ferris Glovsky and Popeo, P.C.

(57) ABSTRACT

Methods and apparatus, including computer program products, are provided for in-memory simulations. The method may include forming a virtual cube including at least one change value representative of a change to a simulation; forming another cube including online data; and combining the virtual cube and the other cube to form a union cube representative of a result of the simulation, the virtual cube, other cube, and the union cube comprised in an in-memory storage and shared for at least a session associated with the simulation. Related systems, methods, and articles of manufacture are also disclosed.

18 Claims, 4 Drawing Sheets

US 10,475,039 B2

IN-MEMORY SIMULATIONS USING MULTIDIMENSIONAL CUBES

FIELD

The subject matter described herein generally relates to business system simulations.

BACKGROUND

Various organizations make use of enterprise resource planning (ERP) software architectures to provide an integrated, computer-based system for management of internal and external resources, such as for example tangible assets, financial resources, materials, customer relationships, and human resources. In general, an ERP software architecture is designed to facilitate the flow of information between business functions inside the boundaries of the organization and manage the connections to outside service providers, stakeholders, and the like. Such architectures often include one or more centralized databases accessible by a core software platform that consolidates business operations, including but not limited to those provided by third party vendors, into a uniform and organization-wide system environment. The core software platform can reside on a centralized server or alternatively be distributed across modular hardware and software units that provide "services" and communicate on a local area network or over a network, such as for example the Internet, a wide area network, a local area network, or the like. Although useful, ERP systems are complex in terms of the data and processes associated with the enterprise.

SUMMARY

In some implementations, methods and apparatus, including computer program products, are provided for in-memory simulations.

In some implementations, there is provided a method. The method may include forming a virtual cube including at least one change value representative of a change to a simulation; forming another cube including online data; and combining the virtual cube and the other cube to form a union cube representative of a result of the simulation, the virtual cube, other cube, and the union cube comprised in an in-memory storage and shared for at least a session associated with the simulation.

In some example embodiments, one of more variations may be made as well as described in the detailed description below and/or as described in the following features. The virtual cube, the other cube, and the union cube may include a multi-dimensional cube. The multi-dimensional cube may be configured in accordance with at least one of a star schema or a snowflake schema. The online data may represent operational data of a business system, rather than simulated data. The in-memory storage may include at least one of a Flash memory or a dynamic memory. The result may be provided to a processor to enable the result to be incorporated into a report of the simulation. A controller may perform at least one of the forming the virtual cube, the forming the other cube, and the combining, and the controller may interface a repository containing the online data and a user interface It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

DETAILED DESCRIPTION

There are increased demands for business systems to provide advanced analytics online including simulations able to perform so-called "what-if" analysis and the like. For example, a business system may provide a simulation system, such as a customer pipeline simulation application. To allow management of the customer relationship pipeline, the customer pipeline simulation may provide a simulation of expected sales revenue based on an existing pipeline of closed deals for a given time period and expected sales opportunities. This simulation may access actual customer pipeline data, such as pending leads, signed letters of intent, signed contracts, sales opportunities, likelihood of closing the deal, and the like to simulate how changes to these and other factors affect revenue and the like. Once the simulation is complete, the results may be reported and presented at a user interface. A user may then evaluate the results and/or re-rerun the simulation by changing one or more factors to assess the impact of the change. In some instances, the simulation is re-run several times (often referred to as "slicing and dicing") by changing one or more factors via the user interface and viewing the results. As the execution of the simulations are computationally demanding, the simulation data may execute more rapidly when the simulation data is stored in dynamic memory, rather than persistent storage. This rapid execution may, in some implementations, enhance the user experience as the user interacts with the user interface to repeatedly change factors/variables and then view the impact of the changes in a report.

Although the simulation may use actual, online data retrieved from, for example, a repository, the simulation data may be kept separate during the simulation to ensure that the simulation data does not contaminate or distort actual, online data. For example, if the what-if simulation changes the number of deals in the sales pipeline to see the impact on revenue, the hypothetical value used for the simulation should not be changed in the actual, online data stored in a repository containing the customer relationship data. However, changes may, in some instances, be committed to the repository, when the user finally decides to implement the change. Returning to the previous example, if the user decides to increase the actual number of deals pending in the opportunities pipeline, the new deal quantity value would then be updated and thus committed to the repository including the customer relationship management data.

Figure 1:
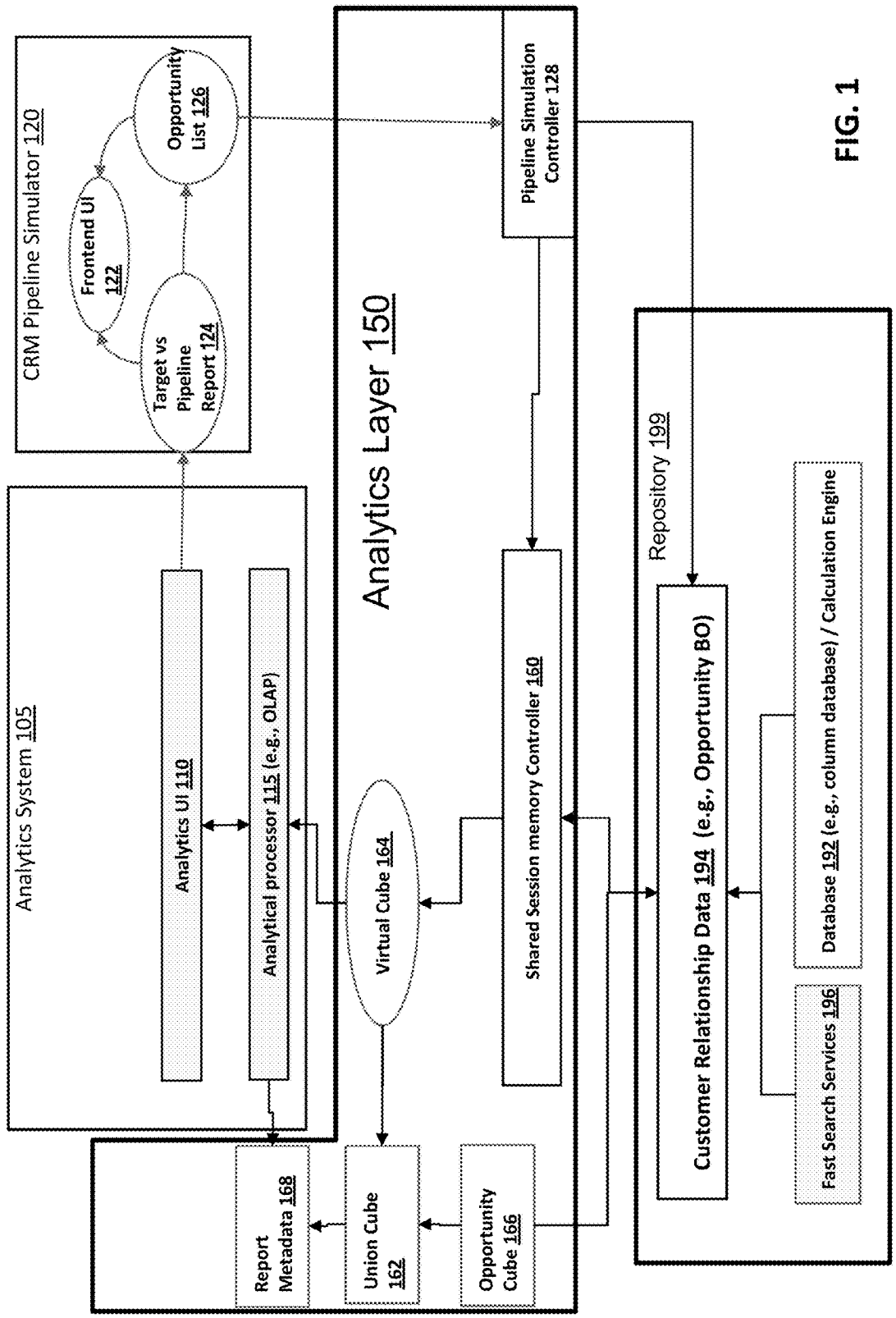
FIG. 1 illustrates a block diagram of an exemplary system including multidimensional cubes, in accordance with some example implementations.

FIG. 1 shows an example of a system 100. System 100 may include an analytics system 105, which further includes a user interface (UI) 110. System 100 may also include an analytical processor 115, such as an online analytics processor, SAP's OLAP, and/or any other type of analytics processor. System 110 may also include a customer relationship management pipeline simulator 120, which further includes a user interface 122. In addition, system 100 may include a persistent repository 199 including a database 192, a fast search service 196, and/or customer relationship management data 194, which may be configured in accordance with a data structure, such as business objects.

In some example implementations, system 100 may include an analytics layer 150, which further includes a pipeline simulation controller 128, a shared memory controller 160, a virtual cube 164, an online data cube, such as opportunity cube 166, and a report metadata module 168. The analytics layer 150 may provide an in-memory storage mechanism, where changes proposed during the simulation are combined with online data obtained from the persistent repository 199. In some example implementations, the analytics layer 150 may provide rapid access and processing of data used to during the simulation, when compared to a persistent storage of the data.

When a simulation is initiated, user interface 110 may be accessed to configure and initiate a simulation. In the case of a what-if simulation, a user at user interface 110 may vary one or more variables, and after each variable is changed, the simulation is re-run and the results of the simulation may be promptly presented as a report, such as reports 124-126 presented at a user interface 122. In the example of FIG. 1, report 124 relates to a target versus pipeline report 124. For example, a target versus pipeline report may provide a sales value for a given pipeline of customers that have completed deals during a certain time period. Report 126 represents a list of targets, such as opportunities representing prospective customer that are in various stages of the sales cycle. These reports may allow a user to assess how changes impact the sales cycle as well as a target sales revenue. For example, a simulation may indicate that pursuing two additional sales opportunities will likely increase sales revenue in a positive way. As such, a user at user interface 122 or 110 may initiate an update of the customer relationship data 194 at repository 199 to reflect an increase of two additional sales opportunities, which causes pipeline simulation controller 128 to commit the change (e.g., two additional sales opportunities) to storage at repository 199.

The simulation may use actual online data at customer relationship data 194 to enhance the veracity of the simulation. The customer relationship data 194 may include business data, such as customer accounts, likelihood of closing, description of sales transactions, values of, or anticipated values of, sales transactions, regions associated with the sales transactions, sales staff members associated with the sales, closing (or anticipated closings date for the sales transaction and any other sales cycle data, and perspective customer leads not yet in the sales pipeline. And, the customer relationship data 194 may be stored in the form of business objects, although other data structures may be used as well. In any case, customer relationship data 194 may be processed during the simulation to allow assessing what-if simulation scenarios, such as whether pursuing additional opportunities will increase or decrease sales revenue, whether increasing the likelihood of closing deals increases sales revenue, whether varying the quantity of the average deal size impacts revenue, whether focusing on existing sales transactions will increase or decrease revenue, and the like.

When the simulation is initiated, an indication may be sent to pipeline simulation controller 128. For example, a message may be sent to indicate that the simulation should be executed with an increase in the quantity of opportunities in the sales pipeline to allow an assessment on the target sales revenue forecast for a given time period.

The pipeline simulation controller 128 may be configured to control data access to online, operational data stored at repository 199. For example, pipeline simulation controller 128 may be configured, so that data used during the simulation is stored in memory, such as random access memory, dynamic random access memory, Flash, and any other form of memory. Moreover, the memory may be configured as shared memory, such as a cache, an in-memory database, an in-memory column database, and the like. The pipeline simulation controller 128 may also control updates to the repository 199. For example, if at the end of a simulation, a user at user interface 122 or 110 decides to commit a change from the simulation, then pipeline simulation controller 128 may allow the change to be updated at repository 199 and the like.

In some implementations, shared session memory controller 160 may be configured so that for a given simulation session, shared session memory controller 160 creates a virtual cube 164, a union cube 162, and an online data cube, such as opportunity cube 166. For example, for a given simulation session, shared session memory controller 160 may create a virtual cube 164 containing the proposed change to the simulation, create a opportunity cube 166 containing online data from repository 199 and the like, and create a union cube 162 containing the union of cubes 164-166. In addition, the cubes 162-166 may be stored in shared memory to enable fast processing by analytics processor 115, when compared to storage in mechanical storage devices, such as for example hard disk drives, optical drives, and the like.

Moreover, in some implementations, the virtual cube 164 may represent a subset of a source, physical cube, such as an OLAP multidimensional cube, although other multidimensional data sources may be used as well. The virtual cube 164 may be defined virtually by linking to physical elements of one or more sources of information, such as physical cubes at repository 199, database 192, fast search service 196, and the like. In some implementations, the physical cubes may be configured in accordance with a star schema or a snowflake schema in a persistent repository, such as repository 199, database 192, and the like.

As noted, the virtual cube 164 may contain multi-dimensional data physically represented as a "star" schema, a "snowflake" schema, or some other type of multidimensional data structure as well. The star schema refers to a structure of data including one or more fact tables and one or more dimension tables. The facts of the fact table are classified along the dimensions. For example, the fact tables hold the main data, while the dimension tables describe dimension data (typically referred to as characteristics) that can be joined to fact tables as needed. The snowflake schema is another way of arranging fact and dimension tables in a relational database such that the entity relationship diagram resembles a snowflake in shape. At the center of the snowflake schema are one or more fact tables, which are connected to multiple dimension group tables, each grouping together several dimensions. The star and snowflake schemas thus provide ways to implement a multi-dimensional database using a relational database.

Figure 2:
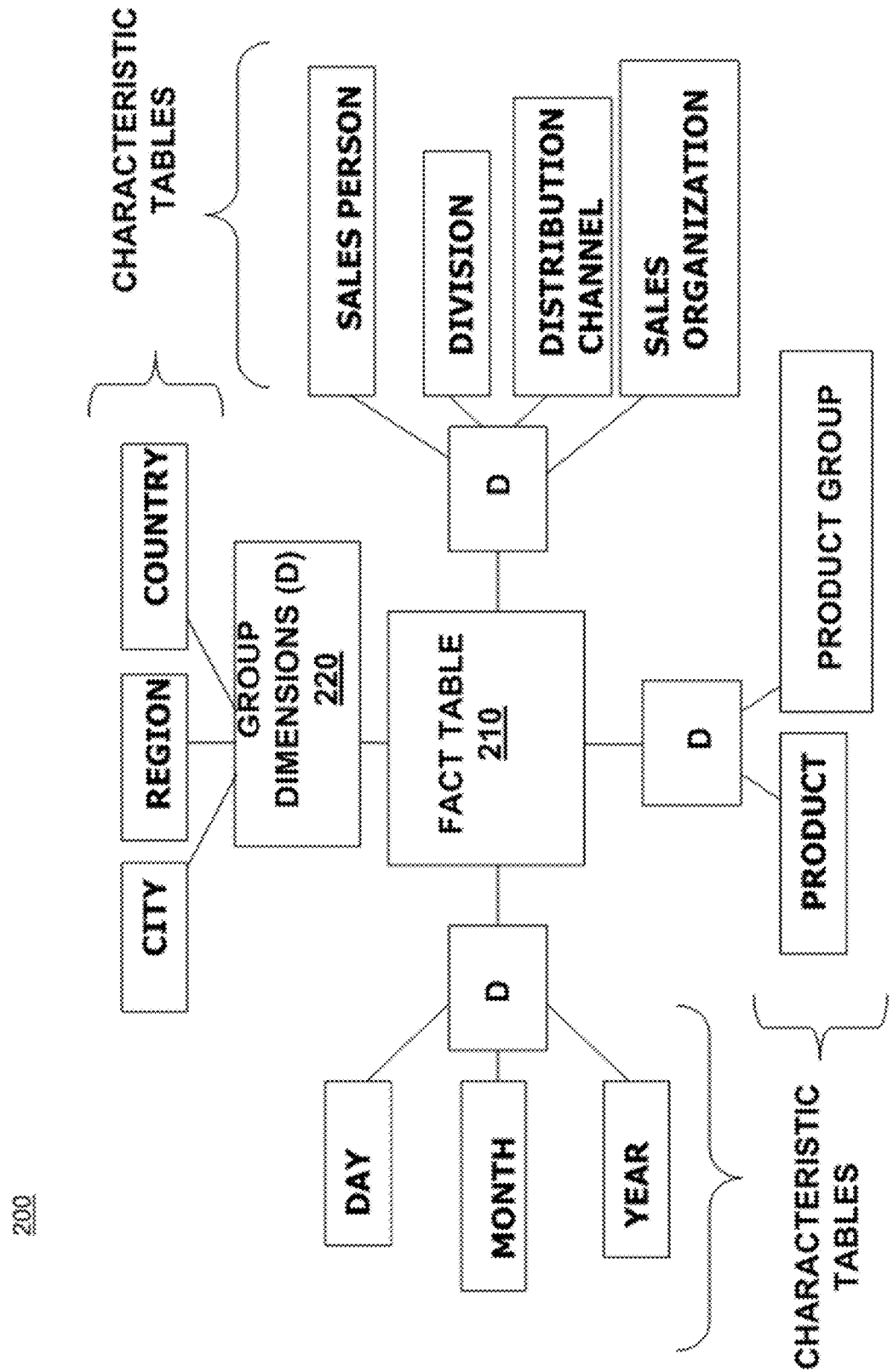
FIG. 2 illustrates an example of a star schema, in accordance with some example implementations.

FIG. 2 depicts an example framework for a cube and, more specifically, a snowflake schema. The cube is a database framework (or architecture) including a central database table, such as a fact table 210. The fact table may include measures (also typically referred to as key figures) corresponding to data of interest. The measures are data that can be aggregated (e.g., added). The fact table may be surrounded by associated dimension group tables, such as dimension group table 220, which group one or more other dimensions, such as characteristic tables. The dimension group tables include references pointing to master data tables including so-called characteristics assigned to the measures. A dimension group table may be used as a simple grouping of characteristics that do not necessarily have hierarchical dependencies. For example, characteristics that logically belong together (district and area, for example, belong to a regional dimension) may be grouped together in a dimension group table. By adhering to this design criterion, dimension group tables are largely independent of each other, and these dimension group tables remain small with regards to data volume, which may be desirable for reasons of performance. The dimension group table offers the advantage of a fewer number of indexes required in the fact tables compared to a star scheme not using dimension group tables.

Referring again to FIG. 1, the virtual cube 164 may, as noted, include simulation data comprising the proposed change(s) to the simulation, and the opportunity cube 166 may be configured to contain actual, online data obtained from persistent storage, such as repository 199, database 192, fast search service 196, and the like. The opportunity cube 166 may also be configured in a manner similar to virtual cube 164. For example, if the virtual cube 164 is configured in accordance with a star schema, the opportunity cube 166 and union cube 162 may also be configured in accordance with a star schema.

During the simulation, the union cube 162 may also be configured as a multidimensional cube in a format similar to the opportunity cube 166 containing the online, data and the virtual cube 164 containing the proposed change for the simulation session. The union cube 162 may be configured to perform a union of the virtual cube 164 and the opportunity cube 166. For example, virtual cube 164 may include simulation data representing the addition of two opportunities to the sales pipeline being simulated, while opportunity cube 166 may include online data for the sales pipeline, so the union cube 162 includes the union of these two datasets and, when processed, provides the outcome of the two simulated opportunities (e.g., the sales revenue given the simulated two additional sales opportunities added to the pipeline). Moreover, because shared memory is used, this union cube 162 may be used to provide the outcome of the simulation without an intermediate persistent storage area to stage the online data, the proposed change, or the union of those datasets. Once union cube 162 contains the union data, the outcome/results can be provided as report metadata 168 to analytical processor 115, where additional reports, such as reports 124 and 126 may be generated as well.

In some implementations, the virtual cube 164, opportunity cube 166, and union cube 162 may be implemented in session memory as noted above, rather than persistent storage, so the simulation data can be kept separate from the online data of repository 199. Moreover, the session memory may allow analytics processor 115 to perform repeated simulations by dynamically accessing and/or dynamically processing simulation data in multidimensional cubes 162-166 stored in session memory, rather than persistent storage.

Figure 3:
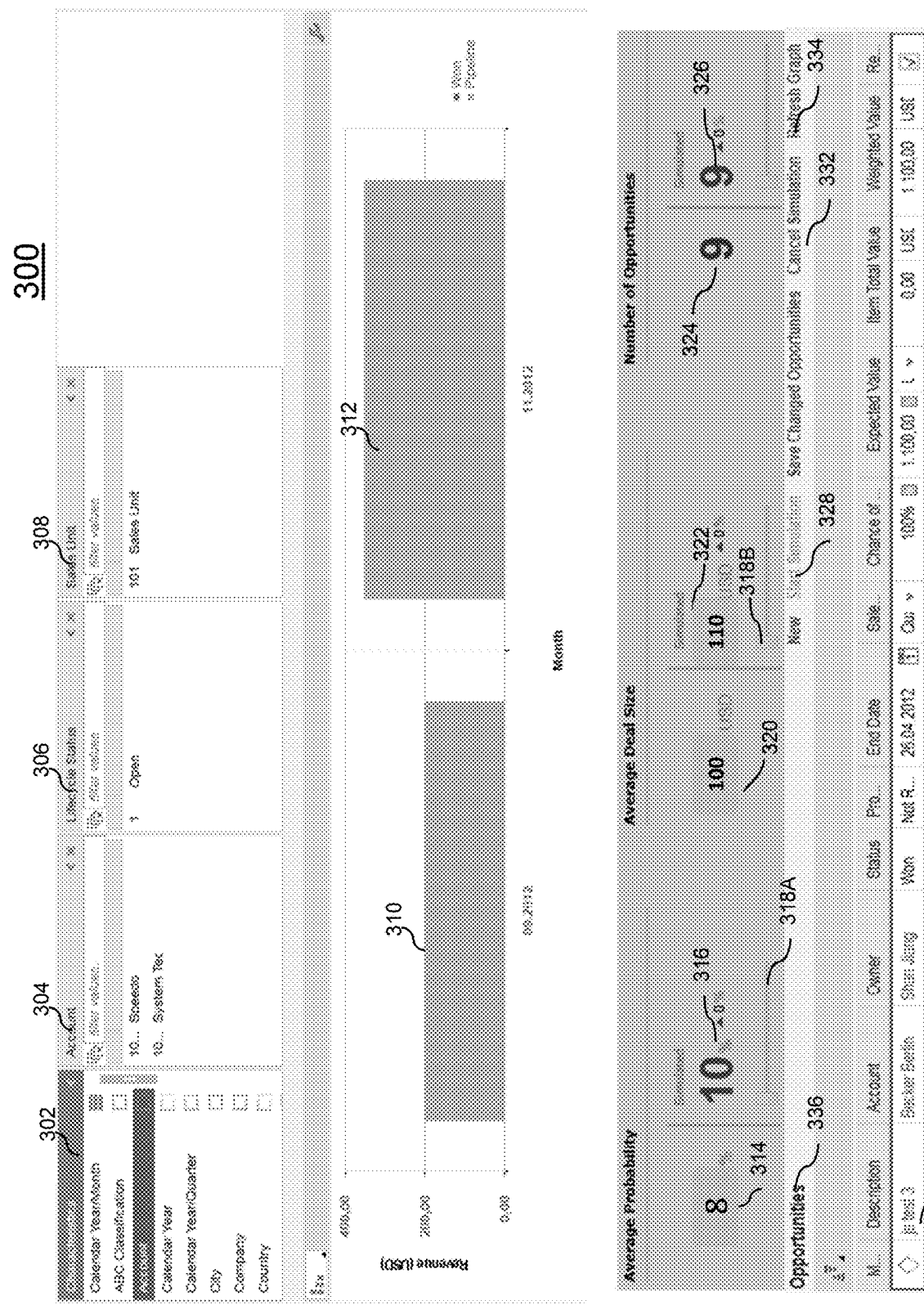
FIG. 3 depicts an example of a report presented at a user interface, in accordance with some example implementations.

FIG. 3 depicts an example of a report 300 presented at a user interface, such as user interface 124 and the like.

The report 300 may present business data categorized by characteristics 302, such as year, month, account, classification, account 304, status 306, unit sales 308, and the like. The report 300 also depicts a value of actual revenue 310 (which represents sales actually closed) versus overall revenue in the sales pipeline 312 (which presumes that all of the deals in the sales pipeline close and thus yield a sale). The report 300 may also depict an average probability 314 representing the percentage of deals entering the sales pipeline that closed, the average deal size 320, and the number of opportunities 324. In addition, the values for the average probability 314, average deal size 320, and number of opportunities 324 represent actual, online values obtained from repository 199, rather than simulated values.

Report 300 also allows a user to change one or more factors/variables and run a simulation. For example, a user may vary the average probability 316, the average deal size 322, and the number of opportunities 326 (for example, by moving graphical elements 318A-B) and select start simulation 328 to see the impact of those changes on revenue 310 and pipeline 312. When start simulation is selected at 328, an indication including the change is sent to pipeline simulation controller 128 (FIG. 1) to run a delta to the simulation. For example, the average probability may be increased to 10 at 316. When this occurs, a message including the revised simulation data of 10 (or a delta value of plus 2) is sent to pipeline simulation controller 128 to enable additional processing via cubes 162-166.

The report 300 may be processed via analytical processor 115 and the multidimensional cubes, such the virtual cube 164, opportunity cube 166, and union cube 162, and these cubes may, as noted, be implemented in session memory. Initially, the report 300 data may come from physical storage at repository 199 as a simulation has not been initiated, so simulation data may not be involved. But once a user starts a simulation, the data may represent simulated data, rather than actual, online data, especially as the simulation is repeated as part of so-called slicing and dicing.

Simulation mode may be selected at 328 to see the impact on revenue of for example a 10% increase in average deal size (e.g., increasing deal size from 100 to 110 at 322). In this example, the pipeline simulation controller 128 may retain a copy the opportunities in local cache and calculate the expected simulation value based on the delta percentage change. At about the same time, the list of opportunities are also copied to a shared memory object for reporting, but the expected value for each opportunity may only contain the delta of the changes, which in this example is 10% of its original expected value. When a user triggers a refresh of report 300, analytic processor 115 retrieves data from the union cube, where the simulated expected value of revenue 310 can be obtained based on the union of opportunity cube 166 and virtual cube 164. Since the opportunity BO contains the original value and shared memory object contains the delta from the simulation, the report results reflect the simulated results. A user can save the simulation results, at which time pipeline simulation controller 128 will save the simulated value into repository 199 and clear shared memory.

Figure 4:
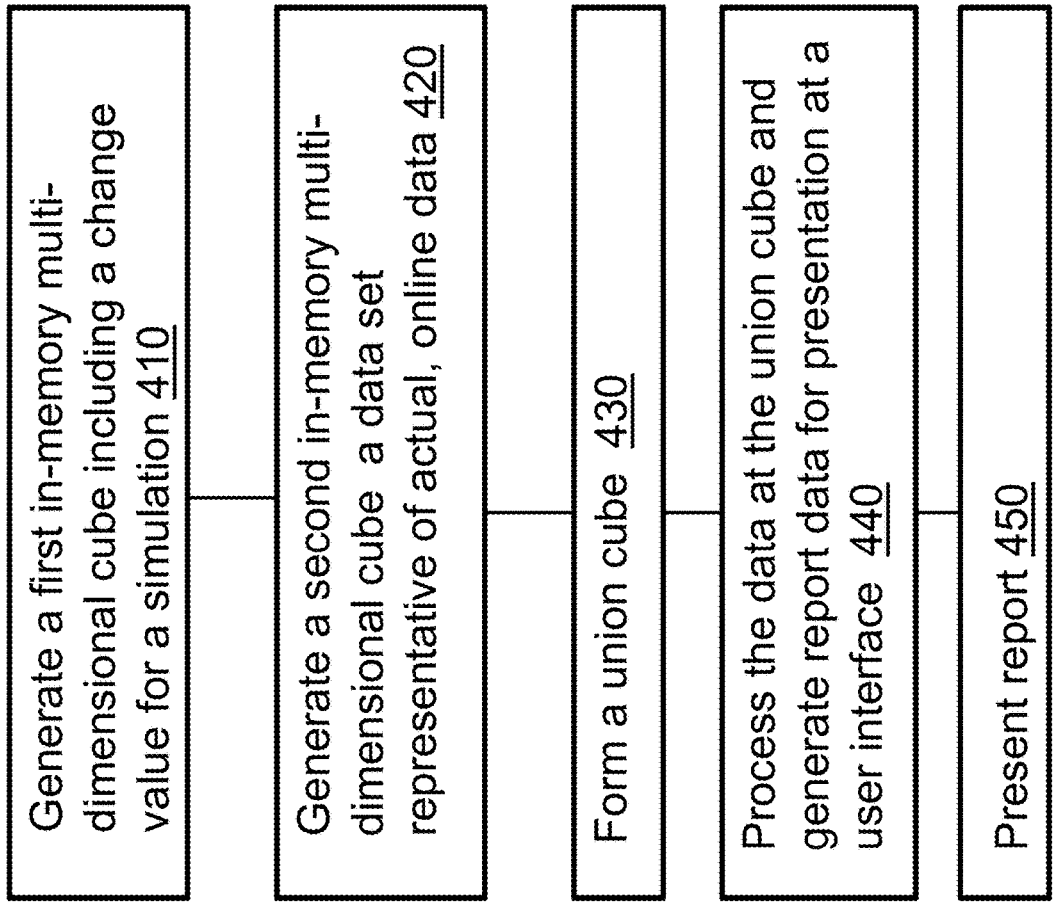
FIG. 4 illustrates a process for providing simulations, in accordance with some example implementations.

FIG. 4 depicts a process 400 for handling simulations. The description of process 400 also refers to FIG. 1.

At 410, a first in-memory multi-dimensional cube may be generated. For example, at least one change value representative of a change to a simulation may be received and configured in the generated in-memory multidimensional cube, such as virtual cube 164. The pipeline simulation controller 128 may receive the change value, such as an increase or a decrease in a variable at report 300, and then store the change value in shared session memory 160 including virtual cube 164.

At 420, a second in-memory multi-dimensional cube may be generated. For example, a data set of representative of online data may be received and configured in a second in-memory multidimensional cube, such as opportunity cube 166. Pipeline simulation controller 128 may prompt shared session memory controller 160 to generate opportunity cube 166 using actual online data obtained from repository 199.

At 430, a union cube may be formed as a union of the first and second in-memory multidimensional cube. For example, shared session memory controller 160 may also form union cube 162 as a union of virtual cube 164 and opportunity cube 166. At 440, an analytics processor may process the data at the union cube and generate report data for presentation at a user interface. For example, analytical processor 115 may access union cube 162 to determine or obtain the results of the simulation. Returning to the previous example, analytical processor 115 may access union cube 162 to obtain the simulated revenue value 310 given an increase in the average probability of closing a sale 316, an increase in the deal size 322, and/or any other variable.

At 450, a report may be presented. The report may be presented at report 300 to show the impact of the change value. For example, report 300 may include a revised revenue value at 310.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example, as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A non-transitory computer-readable storage medium storing one or more programs, the one or more programs comprising instructions, when executed by at least one programmable processor, cause the at least one programmable processor to perform operations comprising:

performing, by a processor, a computer-based simulation, based at least in part on one or more parameters indicative of at least one prospect, to generate a first likelihood of an organization obtaining the at least one prospect, the first likelihood being presented in a first report on a display;

receiving, from the display, an input indicating at least one change to the one or more parameters;

forming, by a memory controller and in response to the input indicating at least one change to the one or more parameters, a first virtual cube in an in-memory session storage, the first virtual cube including at least a first set of data from a first source, the first set of data comprising information representative of the at least one change, the information being provided through a user interface presented on the display;

forming, by the memory controller, a second virtual cube in the in-memory session storage, the second virtual cube including at least a second set of data from a second source different from the first source, the second source representing online, operational data;

rerunning, by a processor, the computer-based simulation by at least combining the first virtual cube and the second virtual cube to form a union cube in the in-memory session storage, the union cube being a multi-dimensional cube and representative of a second likelihood of the organization obtaining the at least one prospect;

generating, for presentation at the user interface, a second report for presentation on the display, the second report containing a result of the computer-based simulation including the second likelihood and the corresponding at least one change; and displaying, the second report containing the result of the computer-based simulation including the second likelihood to enable re-running of the computer-based simulation and/or committing the at least one change to the second source representing online, operational data stored at a persistent repository.

2. The computer-readable storage medium of claim 1, wherein the first virtual cube and the second virtual cube comprise multi-dimensional cubes, and wherein a simulation controller commits the at least one change to the persistent repository comprising a database.

3. The computer-readable storage medium of claim 1, wherein the union cube is configured in accordance with at least one of a star schema or a snowflake schema.

4. The computer-readable storage medium of claim 1, wherein the in-memory session storage comprises at least one of a Flash memory and a dynamic memory.

5. The computer-readable storage medium of claim 1, wherein the memory controller performs the forming, in the in-memory session storage, of the first virtual cube, the forming of the second virtual cube, and the formed union cube for a given session of the computer-based simulation, and wherein the memory controller interfaces the persistent repository.

6. The computer-readable storage medium of claim 1, wherein the union cube is accessible in the in-memory session storage during a session associated with the computer-based simulation.

7. The computer-readable storage medium of claim 1, wherein the first virtual cube is formed virtually by linking to one or more sources of information in a database.

8. The computer-readable storage medium of claim 1, wherein the one or more parameters comprise one or more of average probability, average deal size and number of opportunities associated with the at least one prospect.

9. A method comprising:

performing, by a processor, a computer-based simulation, based at least in part on one or more parameters indicative of at least one prospect, to generate a first likelihood of an organization obtaining the at least one prospect, the first likelihood being presented in a first report on a display;

receiving, from the display, an input indicating at least one change to the one or more parameters;

forming, by a memory controller and in response to the input indicating at least one change to the one or more parameters, a first virtual cube in an in-memory session storage, the first virtual cube including at least a first set of data from a first source, the first set of data comprising information representative of the at least one change, the information being provided through a user interface presented on the display;

forming, by the memory controller, a second virtual cube in the in-memory session storage, the second virtual cube including at least a second set of data from a second source different from the first source, the second source representing online, operational data;

rerunning, by a processor, the computer-based simulation by at least combining the first virtual cube and the second virtual cube to form a union cube in the in-memory session storage, the union cube being a multi-dimensional cube and representative of a second likelihood of the organization obtaining the at least one prospect;

generating, for presentation at the user interface, a second report for presentation on the display, the second report containing a result of the computer-based simulation including the second likelihood and the corresponding at least one change; and displaying, the second report containing the result of the computer-based simulation including the second likelihood to enable re-running of the computer-based simulation and/or committing the at least one change to the second source representing online, operational data stored at a persistent repository.

10. The method of claim 9, wherein the first virtual cube and the second virtual cube comprise multi-dimensional cubes, and wherein a simulation controller commits the at least one change to the persistent repository comprising a database.

11. The method of claim 9, wherein the union cube is configured in accordance with at least one of a star schema or a snowflake schema.

12. The method of claim 9, wherein the in-memory session storage comprises at least one of a Flash memory and a dynamic memory.

13. The method of claim 9, wherein the memory controller performs the forming, in the in-memory session storage, of the first virtual cube, the forming of the second virtual cube, and the formed union cube for a given session of the computer-based simulation, and wherein the memory controller interfaces the persistent repository.

14. A system comprising:

at least one processor; and at least one memory including code which when executed by the at least one processor causes operations comprising:

performing, by a processor, a computer-based simulation, based at least in part on one or more parameters indicative of at least one prospect, to generate a first likelihood of an organization obtaining the at least one prospect, the first likelihood being presented in a first report on a display;

receiving, from the display, an input indicating at least one change to the one or more parameters;

forming, by a memory controller and in response to the input indicating at least one change to the one or more parameters, a first virtual cube in an in-memory session storage, the first virtual cube including at least a first set of data from a first source, the first set of data comprising information representative of the at least one change, the information being provided through a user interface presented on the display;

forming, by the memory controller, a second virtual cube in the in-memory session storage, the second virtual cube including at least a second set of data from a second source different from the first source, the second source representing online, operational data;

rerunning, by a processor, the computer-based simulation by at least combining the first virtual cube and the second virtual cube to form a union cube in the in-memory session storage, the union cube being a multi-dimensional cube and representative of a second likelihood of the organization obtaining the at least one prospect;

generating, for presentation at the user interface, a second report for presentation on the display, the second report containing a result of the computer-based simulation including the second likelihood and the corresponding at least one change; and displaying, the second report containing the result of the computer-based simulation including the second likelihood to enable re-running of the computer-based simulation and/or committing the at least one change to the second source representing online, operational data stored at a persistent repository.

15. The system of claim 14, wherein the first virtual cube and the second virtual cube comprise multi-dimensional cubes, and wherein a simulation controller commits the at least one change to the persistent repository comprising a database.

16. The system of claim 14, wherein the union cube is configured in accordance with at least one of a star schema or a snowflake schema.

17. The system of claim 14, wherein the in-memory session storage comprises at least one of a Flash memory and a dynamic memory.

18. The system of claim 14, wherein the memory controller performs the forming, in the in-memory session storage, of the first virtual cube, the forming of the second virtual cube, and the formed union cube for a given session of the computer-based simulation, and wherein the memory controller interfaces the persistent repository.

* * * * *